United States Patent [19]

Speraw

[11] Patent Number: 4,867,695

[45] Date of Patent: Sep. 19, 1989

[54] CIRCUIT BOARD SEPARATION DEVICE

[75] Inventor: Floyd G. Speraw, Lexington, S.C.

[73] Assignee: NCR Corporation, Dayton, Ohio

[21] Appl. No.: 282,720

[22] Filed: Dec. 12, 1988

[51] Int. Cl.⁴ .......................................... H01R 13/62
[52] U.S. Cl. .................................................. 439/152
[58] Field of Search ................................. 439/152–160

[56] References Cited

U.S. PATENT DOCUMENTS

| | | | |
|---|---|---|---|
| T876,004 | 12/1969 | Andreini et al. | 339/45 |
| 2,477,895 | 8/1949 | Pollock | 439/156 |
| 3,311,863 | 5/1964 | Beale | 339/45 |
| 3,451,034 | 12/1966 | Beale | 339/17 |
| 4,083,616 | 4/1978 | McNiece et al. | 339/45 |
| 4,193,656 | 3/1980 | Ward | 439/152 |
| 4,235,496 | 11/1980 | Aug et al. | 339/45 |
| 4,493,518 | 1/1985 | Asick | 339/45 |
| 4,537,454 | 8/1985 | Douty et al. | 339/45 |
| 4,606,591 | 8/1986 | Bloch | 339/45 |
| 4,620,756 | 11/1986 | Gattie et al. | 339/17 |
| 4,628,413 | 12/1986 | Speraw | 361/415 |
| 4,638,405 | 1/1987 | Smith | 361/399 |

*Primary Examiner*—Joseph H. McGlynn
*Attorney, Agent, or Firm*—Wilbert Hawk, Jr.; Stephen F. Jewett; Douglas S. Foote

[57] ABSTRACT

The subject invention is a separation device for first and second generally parallel printed circuit boards connectable by a plurality of pins projecting normally thereto. The separation device comprises a first member attachable to the first board and having a hole extending laterally therethrough. The device also comprises a second member having a shaft mateable with the hole, an eccentric body, and means for rotating the second member. When rotated, the eccentric body provides a separation force on the boards.

20 Claims, 3 Drawing Sheets

FIG. I

CIRCUIT BOARD SEPARATION DEVICE

CIRCUIT BOARD SEPARATION DEVICE

The present invention relates to a device for separating two, face mounted printed circuit boards. More particularly, it relates to a device for separating boards connected by a relatively large number of pins.

BACKGROUND OF THE INVENTION

The ever increasing density of logic and other electronic modules used in computer systems has resulted in the development of larger modules (hereinafter referred to as sub-modules) which are basically intermediate size planar printed circuit boards to which the smaller modules are connected. The modules are typically connected to the sub-module by pins and are interconnected by conductors within the sub-module. Connections from the sub-module to other parts of the system are provided by means of a plurality of pins projecting normally to the sub-module.

The sub-module may be connected to another sub-module or a still larger printed circuit board in a face to face relationship, wherein the pins on one board are inserted into one or more sockets on the other board. Frequently, high pin count sub-modules have the pins grouped on the printed circuit board to form discrete connectors. Due to the many logic modules which may be connected to a sub-module, a relatively large number of connecting pins from each sub-module connector are required. For example, sub-modules with over three hundred pins per connector may be required for some applications.

A particular problem which high pin count connectors creates is that a relatively large force is needed to separate two boards. If a single pin requires a six to eight ounce extraction force, three hundred pins requires a one hundred to one hundred fifty pound extraction force. Application of such a force can damage one or both boards and/or bend pins so that reinsertion is difficult, if not impossible.

OBJECTS OF THE INVENTION

It is therefore an object of the present invention to provide a new and improved circuit board separation device.

It is another object of the present invention to provide a device for separating circuit boards without damaging the boards or bending the pins which connect the boards.

It is yet another object of the present invention to provide a device for separating, with a relatively small applied force, two circuit boards connected by a relatively high number of pins.

It is a further object of the present invention to provide a circuit board separation device which is reliable, accessible and easy to operate.

SUMMARY OF THE INVENTION

The present invention is a separation device for first and second generally parallel printed circuit boards connectable by a plurality of pins projecting normally thereto. The separation device comprises a first member attachable to the first board and having a hole extending laterally therethrough. The device further comprises a second member having a shaft mateable with the hole, an eccentric body, and means for rotating the second member. When rotated, the eccentric body provides a separation force on the boards.

DETAIL DESCRIPTION OF THE INVENTION

Figure 1:
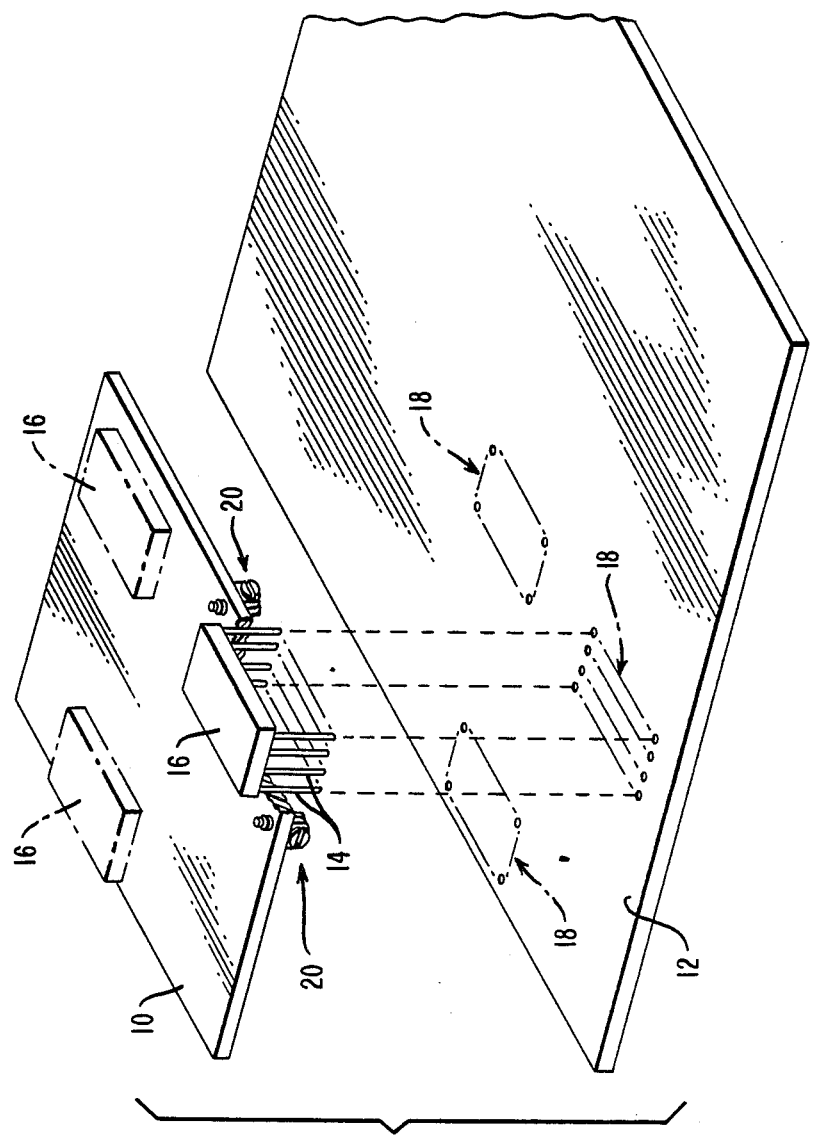
FIG. 1 is an exploded view of parallel printed circuit boards employing several separation devices according to the present invention.

FIG. 1 shows a generally planar sub-module or printed circuit board 10 connectable to a generally planar printed circuit board 12 by means of a plurality of pins 14. When connected, boards 10 and 12 will be generally parallel to each other with pins 14 extending normally thereto. In the embodiment shown, pins 14 extend from several discrete connectors 16. Each such connector 16 has a corresponding socket 18 on board 12 for receiving pins 14. A plurality of separation devices 20, according to the present invention, are located proximate to pins 14. The number of devices 20 required will vary depending upon the number of pins 14 in each connector 16. For example, a connector 16 having 240 pins in a four by example, a connector 16 having 240 pins in a four by sixty array may require a separation device 20 at each end of the connector. In general, it is desirable to locate devices 20 proximate to pins 14 but in non-interfering locations. On particularly long connectors 16, one or more separation devices 20 may be located along the length of the connector.

Figure 2:
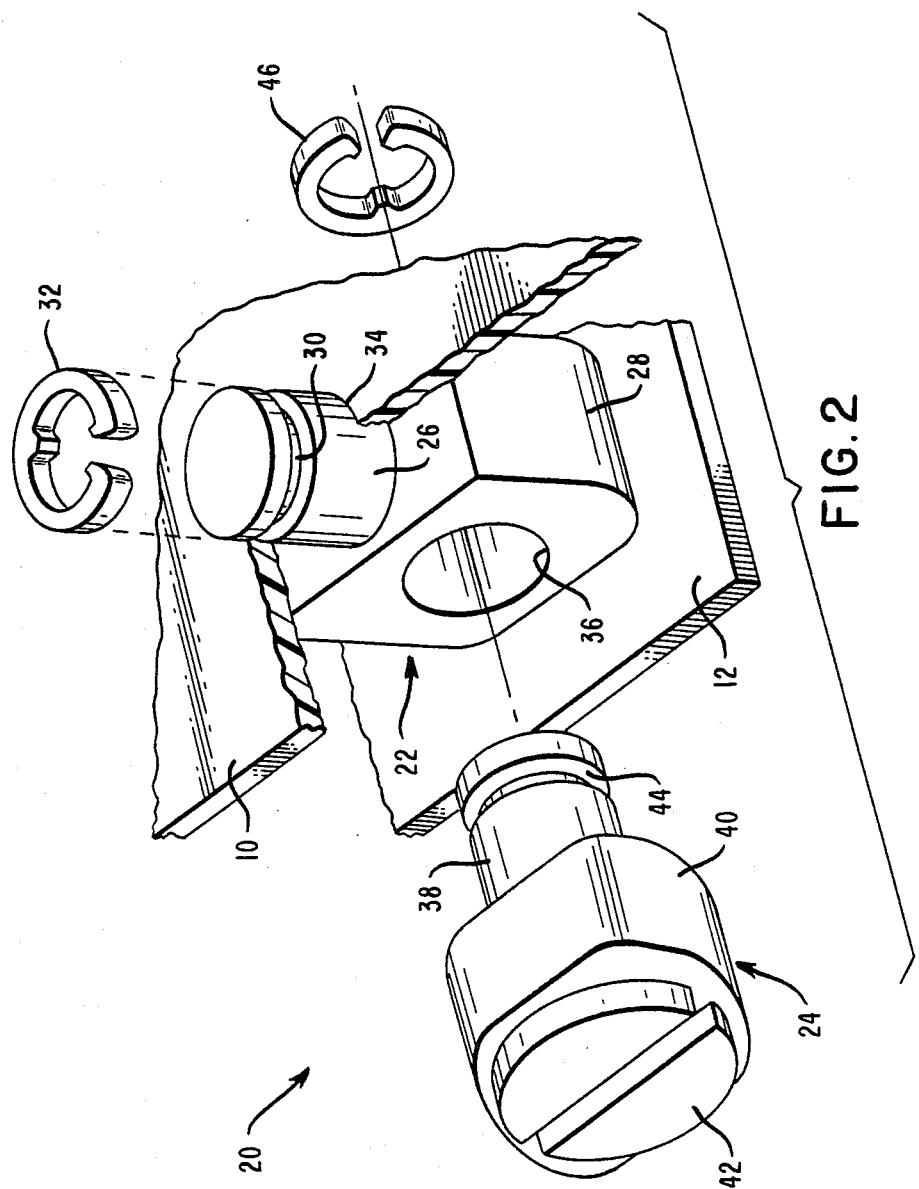
FIG. 2 is a partially cut-away, exploded view of a separation device according to one form of the present invention.

FIG. 2 shows a partially cut-away exploded view of a separation device 20 according to one form of the present invention. Device 20 is positioned between generally parallel printed circuit boards 10 and 12 and includes members 22 and 24. Members 22 and 24 are connected (as described more fully hereinafter) in a relatively rotatable arrangement. Member 22 has an integral shaft 26 and pivot block 28. Pivot block 28 includes a hole 36 extending laterally therethrough in a direction generally parallel to the planes of boards 10 and 12. Member 22 is attachable to board 10 in the embodiment shown, but alternatively may be attached to board 12. Shaft 26 extends through board 10 and pivot block 28 extends between boards 10 and 12.

Device 20 is attachable to board 10 by means of a groove 30 on shaft 26 and a snap retaining ring 32. Groove 30 circumscribes a portion of shaft 26 which extends through board 10. Retaining ring 32 is insertable into groove 30 and has an outer diameter greater than that of the opening 34 in board 10 through which shaft 26 passes. Pivot block 28 also has greater breadth than opening 34. In this manner, member 22 may be attached to board 10 when shaft 26 is passed through opening 34 and ring 32 inserted into groove 30.

Member 24 has a shaft 38, an eccentric body 40 and a slotted head 42. Shaft 38 is mateable with hole 36 and, when assembled, extends through pivot block 28 by way of hole 36. Shaft 38 is retainable within hole 36 by means of a groove 44 on shaft 38 and a snap retaining ring 46. Groove 44 circumscribes a portion of shaft 38 which extends through pivot block 28. Retaining ring 46 is insertable into groove 44 and has an outer diameter greater than that of hole 36. Eccentric body 40 also has greater breadth than hole 36. In this manner, members 22 and 24 are connected in a relatively rotatable arrangement. More particularly, member 24 is retained by pivot block 28 but is free to rotate, as will be described more fully hereinafter.

Figure 3:
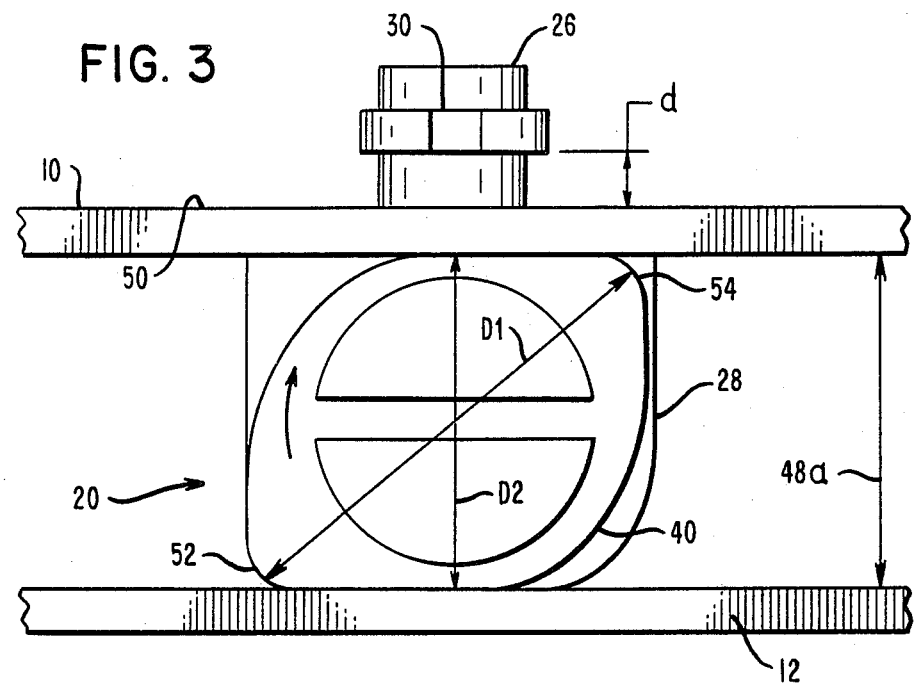
FIG. 3 is an end view of the separation device of FIG. 2 with printed circuit boards engaged.

FIG. 3 shows an end view of device 20 as installed between boards 10 and 12. The separation or gap 48a between boards 10 and 12 is the minimum distance required for the connecting pins 14 (not shown) to be fully inserted for electrical connection between the boards. In other words, when connectors 16 and sockets 18 (shown in FIG. 1) are fully mated, boards 10 and 12 do not touch but are separated by gap 48a. Groove 30 is positioned on shaft 26 so that groove 30 is displaced away from the outer surface 50 of board 10 by a distance d when boards 10 and 12 are connected by full engagement of pins 14.

Figure 4:
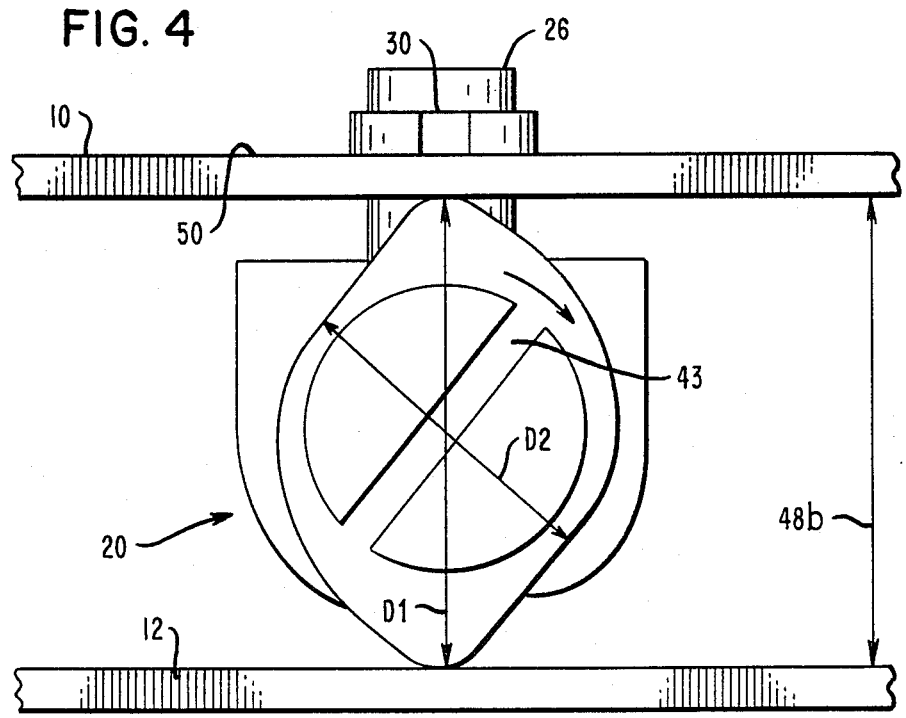
FIG. 4 is an end view of the separation device of FIG. 2 with printed circuit boards disengaged.

FIG. 4 shows a similar view as FIG. 3 with boards 10 and 12 separated by a gap 48b. Gap 48b is sufficient to allow uncoupling of the boards by disengagement of pins 14 (not shown). Groove 30 on shaft 26 is displaced proximate to outer surface 50 of board 10 when the boards are separated by disengagement of pins 14. FIG. 4 shows the maximum separation of boards 10 and 12 which is attainable by separation device 20. It should be clear that device 20 is not attached to board 12 so it does not hold boards 10 and 12 together. Thus, boards 10 and 12, as shown in FIG. 4, are uncoupled.

Referring again to FIG. 3, it can be seen that lobed body 40 has two lobes labeled 52 and 54. Lobes 52 and 54 define a maximum diameter labeled D1 for lobed body 40. Lobed body 40 also has a minimum diameter D2 which is equal to or less than the gap 48a between the coupled boards 10 and 12. In a preferred embodiment, diameter D2 is perpendicular to slot 43 of slotted head 42, and diameter D2 is not perpendicular to diameter D1. When pins 14 (not shown) fully engage the boards 10 and 12, diameter D2 is normal to the boards. In contrast, pins 14 will be disengaged when diameter D1 is normal to the boards (see FIG. 4).

When printed circuit boards 10 and 12 are connected by pins 14, separation device 20 assumes the position shown in FIG. 3. The minimum diameter D2 of lobed body 40 is small enough to fit within the gap 48a. If the diameter D2 is equal to gap 48a, lobed body 48a will act as a stand-off thereby providing additional support between the boards. In a preferred embodiment, the minimum diameter D2 of lobed body 48a is also equal to the height of pivot block 28.

In order to separate the boards, a device such as a screw driver is inserted into slot 43 on head 42 and twisted in a clockwise direction as shown in FIGS. 3 and 4. This turns head 42 and causes member 24 and its eccentric body 40 to rotate thereby providing a separation force on boards 10 and 12. If eccentric body 40 is rotated clockwise from its position shown in FIG. 1, slot 43 will pass by a normal position vis-a-vis boards 10 and 12 before diameter D1 reaches the normal position shown in FIG. 4. In a preferred embodiment, the pins 14 connecting boards 10 and 12 are nearly disengaged when slot 43 is normal to the boards. A continued clockwise turning to the position shown in FIG. 4 provides enough additional separation to fully disengage the boards.

Once member 22 is attached to board 10 by snap ring 32 and member 24 is retained by pivot block 20 by ring 46, separation device 20 is completely connected to board 10. This allows board 10 to be separated from board 12 without parts of device 20 becoming detached. Thus, there are no stray parts to track or be installed when the boards are again connected.

It will be clear to those skilled in the art that the present invention is not limited to the specific embodiment disclosed and illustrated herein. It will also be understood that the dimensions and proportional and structural relationships shown in the drawings are illustrated by way of example only and these illustrations are not to be taken as the actual dimensions or proportional structural relationships used in the separation device of the present invention.

Numerous modifications, variations, and full and partial equivalents can be undertaken without departing from the invention as limited only by the spirit and scope of the appended claims.

What is desired to be secured by Letters Patent of the United States is as follows.

What is claimed is:

1. A separation device for first and second generally parallel printed circuit boards connectable by a plurality of pins projecting normally thereto, comprising:
   a first member attachable to said first board and having a hole extending laterally therethrough;
   means for attaching said first member to said first board;
   a second member having a shaft mateable with said hole, an eccentric body, and means for rotating said second member; and
   means for retaining said shaft within said hole;
   wherein said eccentric body provides a separation force on said boards when rotated.

2. The separation device according to claim 1, wherein said first member has an integral shaft and pivot block, with said shaft extending through said first board and said pivot block extending between said boards, and wherein said pivot block includes said hole.

3. The separation device according to claim 2, wherein said attaching means includes a groove circumscribing said first member shaft on a portion of the shaft which extends through said first board, and a retaining ring insertable into said groove.

4. The separation device according to claim 3, wherein said groove is positioned on said shaft so that the groove is displaced away from the outer surface of said first board when said boards are connected by full engagement of said pins and may be displaced proximate to said outer surface when said boards are separated by disengagement of said pins.

5. The separation device according to claim 1, wherein said retaining means includes a groove circumscribing said second member shaft on a portion of the shaft which extends through said hole, and a retaining ring insertable into said groove.

6. The separation device according to claim 1, wherein said rotating means includes a slotted head for receiving a screw driver.

7. The separation device according to claim 1, wherein said eccentric body has first and second lobes, said lobes defining the maximum diameter of said body.

8. The separation device according to claim 7, wherein said eccentric body has a minimum diameter, and wherein said pins may fully engage said boards when said minimum diameter is normal to said boards.

9. The separation device according to claim 8, wherein said pins are disengaged when said eccentric body is turned so that said maximum diameter defined by said lobes is normal to said boards.

10. The separation device according to claim 7, wherein the maximum diameter defined by said first and second lobes is not perpendicular to said minimum diameter.

11. A separation device for first and second generally parallel printed circuit boards connectable by a plurality of pins projecting normally thereto, comprising:
 a first member having an integral shaft and pivot block and attachable to said first board, with said shaft extending through said first board and said pivot block extending between said boards, wherein said pivot block includes a hole extending laterally therethrough;
 means for attaching said first member to said first board, including a groove circumscribing said first member shaft on a portion of the shaft which extends through said first board and a retaining ring insertable into said groove;
 a second member having a shaft mateable with said hole, an eccentric body having first and second lobes said lobes defining a maximum diameter of said body, and means for rotating said second member; and
 means for retaining said shaft within said hole, including a groove circumscribing said second member shaft on a portion of the shaft which extends through said hole and a retaining ring insertable into said groove;
 wherein said eccentric body provides a separation force on said boards when rotated.

12. The separation device according to claim 11 wherein said groove is positioned on said shaft so that the groove is displaced away from the outer surface of said first board when said boards are connected by full engagement of said pins and may be displaced proximate to said outer surface when said boards are separated by disengagement of said pins.

13. The separation device according to claim 12, wherein said eccentric body has a minimum diameter, and wherein said pins may fully engage said boards when said minimum diameter is normal to said boards.

14. The separation device according to claim 13, wherein said pins are disengaged when said eccentric body is turned so that said maximum diameter defined by said first and second lobes is normal to said boards.

15. The separation device according to claim 14, wherein the maximum diameter defined by said first and second lobes is not perpendicular to said minimum diameter.

16. The separation device according to claim 15, wherein said rotating means includes a slotted head for receiving a screw driver.

17. A separation device for first and second generally parallel printed circuit boards connectable by a plurality of pins projecting normally thereto, comprising:
 a first member attachable to said first board and having a hole extending laterally therethrough; and
 a second member having a shaft mateable with said hole, an eccentric body, and means for rotating said second member;
 wherein said eccentric body provides a separation force on said boards when rotated.

18. The separation device according to claim 17, wherein said eccentric body has a minimum diameter, and wherein said pins may fully engage said boards when said minimum diameter is normal to said boards.

19. The separation device according to claim 18, wherein said eccentric body has a maximum diameter, and wherein said pins are disengaged when said eccentric body is turned so that said maximum diameter defined by said first and second lobes is normal to said boards.

20. A separation device for first and second generally parallel printed circuit boards connectable by a plurality of pins projecting normally thereto, comprising:
 a first member attachable to said first board; and
 a second member having an eccentric body, and means for rotating said second member;
 wherein said first and second members are connected in a relatively rotatable arrangement and wherein said eccentric body provides a separation force on said boards when rotated.

* * * * *